(12) United States Patent
He (10) Patent No.: US 11,528,830 B2
(45) Date of Patent: Dec. 13, 2022

(54) ADHESION STRUCTURE AND ELECTRONIC DEVICE

(71) Applicant: CTRON Advanced Material Co., Ltd, Xinxiang (CN)

(72) Inventor: Ming-Hsiang He, Xinxiang (CN)

(73) Assignee: CTRON ADVANCED MATERIAL CO., LTD., Xinxiang (CN)

( * ) Notice: Subject to any disclaimer, the term of this patent is extended or adjusted under 35 U.S.C. 154(b) by 373 days.

(21) Appl. No.: 16/985,827

(22) Filed: Aug. 5, 2020

(65) Prior Publication Data
US 2021/0045267 A1 Feb. 11, 2021

(30) Foreign Application Priority Data
Aug. 9, 2019 (CN) .......................... 201921288466.0

(51) Int. Cl.
*C09J 11/04* (2006.01)
*H05K 7/20* (2006.01)
*C08K 3/04* (2006.01)

(52) U.S. Cl.
CPC .......... *H05K 7/20963* (2013.01); *C09J 11/04* (2013.01); *C08K 3/042* (2017.05); *C08K 2201/003* (2013.01); *C08K 2201/011* (2013.01)

(58) Field of Classification Search
CPC ........ C08K 2201/003; C08K 2201/011; C08K 3/042; C09J 11/04; C09J 2203/326; C09J 2301/124; C09J 2301/312; C09J 2301/408; C09J 7/30; H05K 7/20481; H05K 7/20963
See application file for complete search history.

(56) References Cited

U.S. PATENT DOCUMENTS

2018/0187987 A1 7/2018 Cai et al.
2020/0081312 A1* 3/2020 Huang ................ G02F 1/13439

FOREIGN PATENT DOCUMENTS

| CN | 105101755 A | 11/2015 |
|---|---|---|
| CN | 109880542 A | 6/2019 |
| KR | 20170136161 A | 12/2017 |
| TW | 201843102 A | 12/2018 |

* cited by examiner

*Primary Examiner* — Mark Kopec
*Assistant Examiner* — Jaison P Thomas
(74) *Attorney, Agent, or Firm* — Muncy, Geissler, Olds & Lowe, P.C.

(57) ABSTRACT

An adhesion structure and an electronic device are provided. The adhesion structure includes a substrate and an adhesive layer. The adhesive layer is disposed on the substrate, and the adhesive layer includes a plurality of graphene microplates. A part of the graphene microplates protrude from two opposite surfaces of the adhesive layer. The thickness of the graphene microplates is greater than or equal to 0.3 nanometers and is less than or equal to 3 nanometers. The flake diameter of the graphene microplates is greater than or equal to 1 micrometer and is less than or equal to 30 micrometers. The adhesion structure can not only provide the adhesive function, but also improve the heat dissipation efficiency of electronic device.

12 Claims, 5 Drawing Sheets

FIG. 5F

ADHESION STRUCTURE AND ELECTRONIC DEVICE

CROSS REFERENCE TO RELATED APPLICATIONS

This Non-provisional application claims priority under 35 U.S.C. § 119(a) on Patent Application No(s). 201921288466.0 filed in People's Republic of China on Aug. 9, 2019, the entire contents of which are hereby incorporated by reference.

BACKGROUND

Technology Field

The present disclosure relates to an adhesion structure and an electronic device with the adhesion structure.

Description of Related Art

With the progress of science and technology, the design and research of flat electronic devices, such as display panels, backlight modules, or lighting modules, are developed toward thinness, large size, and high performance. In the case of thinning, large scale and high performance, the electronic devices will inevitably generate more heat than before, so the "heat dissipation" is already an indispensable function of electronic devices.

Taking a flat display device, such as an organic light-emitting diode (OLED) display, as an example, a conventional technique is to attach a heat dissipation structure to the back of the display device by using, for example, an adhesive material for dissipating the heat energy generated by the display device to the environment through the heat dissipation structure. However, the conventional adhesive members are generally made of heat-insulating materials, and the thermal conductivity thereof is quite poor, which indirectly affects the heat dissipation efficiency of the display devices.

SUMMARY

An objective of this disclosure is to provide an adhesion structure and an electronic device with the adhesion structure. The adhesion structure can not only provide the adhesive function, but also improve the heat dissipation efficiency of electronic device.

To achieve the above, the present disclosure provides an adhesion structure, which comprises a substrate and a first adhesive layer. The first adhesive layer is disposed on the substrate, and the first adhesive layer comprises a plurality of first graphene microplates. A part of the first graphene microplates protrude from two opposite surfaces of the first adhesive layer. The thickness of each of the first graphene microplates is greater than or equal to 0.3 nanometers and is less than or equal to 3 nanometers, and the flake diameter of each of the first graphene microplates is greater than or equal to 1 micrometer and is less than or equal to 30 micrometers.

To achieve the above, the disclosure also provides an electronic device, which comprises a heat source, an adhesion structure and a heat dissipation structure. The adhesion structure is disposed on the heat source and comprises a substrate, a first adhesive layer and a second adhesive layer. The first adhesive layer is disposed on the substrate, and the second adhesive layer is disposed at one side of the substrate away from the first adhesive layer. The first adhesive layer or the second adhesive layer comprises a plurality of graphene microplates. A part of the graphene microplates protrude from two opposite surfaces of the first adhesive layer or the second adhesive layer. The thickness of each of the graphene microplates is greater than or equal to 0.3 nanometers and is less than or equal to 3 nanometers, and the flake diameter of each of the graphene microplates is greater than or equal to 1 micrometer and is less than or equal to 30 micrometers. The heat dissipation structure is connected to the heat source through the adhesion structure.

As mentioned above, in the adhesion structure and the electronic device with the adhesion structure of this disclosure, the adhesive layer(s) comprises graphene microplates, a part of the graphene microplates protrude from two opposite surfaces of the adhesive layer, and the graphene microplates are defined within specific conditions. Accordingly, the adhesion structure of this disclosure can provide the adhesive function, and improve the heat dissipation efficiency of electronic device.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The adhesion structure of this disclosure can be applied to various electronic devices such as, the mobile phone, laptop computer, tablet computer, TV, display device, backlight module, lighting module, or any of other flat electronic devices, and this disclosure is not limited. The adhesion structure can provide the adhesive function. Besides, when applied to the electronic device, the adhesion structure of this disclosure can also improve the heat dissipation efficiency of electronic device.

Figure 1A:
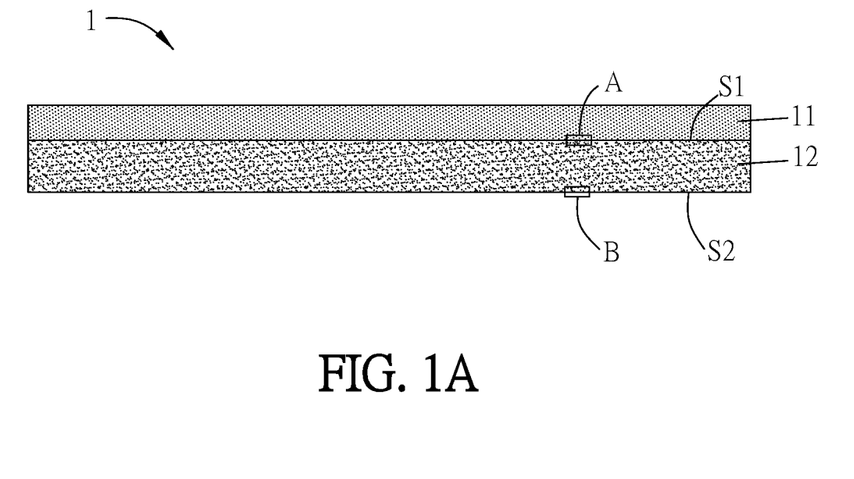
FIG. 1A is a schematic diagram of an adhesion structure according to an embodiment of this disclosure.
Figure 1B:
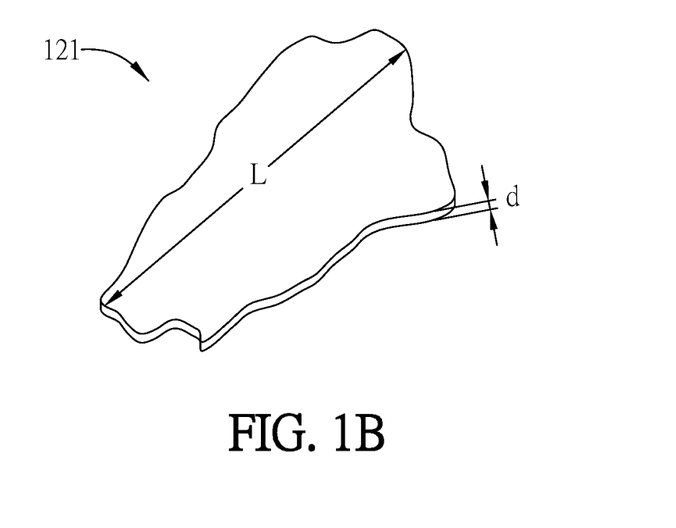
FIG. 1B is a schematic diagram showing the graphene microplates in the adhesive layer of the adhesion structure as shown in FIG. 1A.
Figure 2A:
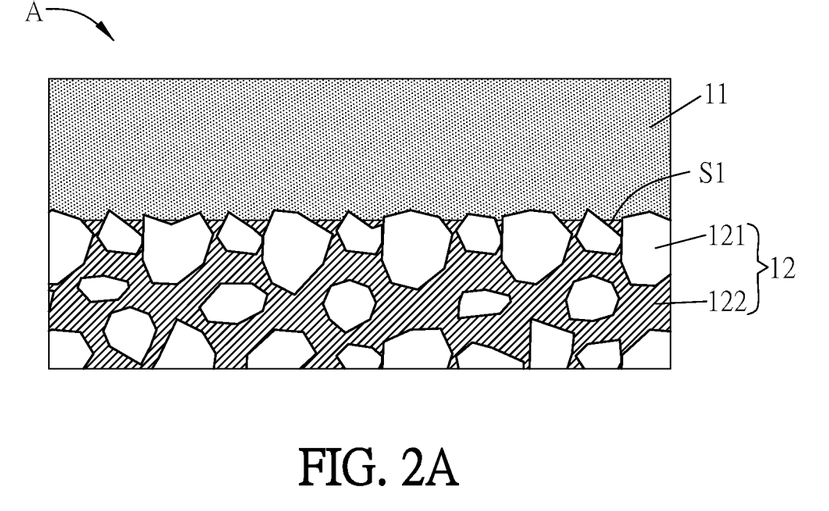
FIGS. 2A and 2B are enlarged views of the regions A and B of the adhesion structure as shown in FIG. 1A.
Figure 2B:
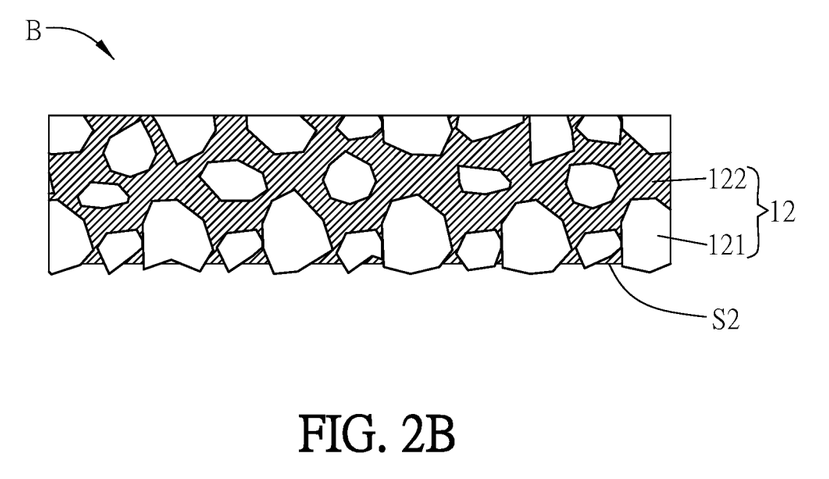

FIG. 1A is a schematic diagram of an adhesion structure according to an embodiment of this disclosure, FIG. 1B is a schematic diagram showing the graphene microplates in the adhesive layer of the adhesion structure as shown in FIG. 1A, and FIGS. 2A and 2B are enlarged views of the regions A and B of the adhesion structure as shown in FIG. 1A.

Referring to FIGS. 1A and 1B, the adhesion structure 1 of this embodiment comprises a substrate 11 and an adhesive layer 12.

The material of the substrate 11 can be, for example but not limited to, paper, cloth, polyester (e.g. polyethylene terephthalate, PET), or a combination thereof, and this disclosure is not limited thereto.

The adhesive layer 12 is disposed on the substrate 11. In this embodiment, the adhesive layer 12 comprises two opposite surfaces, including an upper surface S1 and a lower surface S2. For example, the upper surface S1 of the adhesive layer is attached to the lower surface of the substrate 11. As shown in FIGS. 2A and 2B, the adhesive layer 12 comprises a plurality of graphene microplates 121 and an adhesion material 122, and the graphene microplates 121 are mixed in the adhesion material 122. In addition, a part of the graphene microplates 121 are completely disposed inside the adhesive layer 12, and a part of the graphene microplates 121 protrude from two opposite surfaces of the adhesive layer 12. That is, some of the graphene microplates 121 protrude from the upper surface S1 (FIG. 2A) and the lower surface S2 (FIG. 2B) of the adhesive layer 12.

Referring to FIG. 1B, in the adhesive layer 12, the thickness d of each graphene microplate 121 is greater than or equal to 0.3 nanometers and is less than or equal to 3 nanometers (0.3 nm≤d≤3 nm), and the flake diameter L of each graphene microplate 121 is greater than or equal to 1 micrometer and is less than or equal to 30 micrometers (1 μm≤L≤30 μm). In the adhesive layer 12 of this embodiment, the content of the graphene microplates 121 is greater than 0 and is less than or equal to 15% (0<the content of the graphene microplates 121≤15%). For example, the content of the graphene microplates 121 can be 1.5%, 3.2%, 5%, 7.5%, 11%, or 13%. In addition, the adhesion material 122 can be, for example but not limited to, a pressure sensitive adhesive (PSA). The material of the adhesion material can be, for example, a rubber material, an acrylic material, a silicone material, or a combination thereof. The chemical composition thereof can be rubber, acrylic, or organic silicone, or a combination thereof. The present disclosure is not limited.

With reference to FIG. 1A, since the adhesive layer 12 comprises the adhesion material 122, so the adhesive layer 12 has the adhesive property. Accordingly, the lower surface S2 of the adhesive layer 12 can attach the entire adhesion structure 1 including the substrate 11 and the adhesive layer 12 to another object. In addition, the adhesive layer 12 further comprises the graphene microplates 121, the thickness d of each graphene microplate 121 is greater than or equal to 0.3 nanometers and is less than or equal to 3 nanometers, the flake diameter L of each graphene microplate 121 is greater than or equal to 1 micrometer and is less than or equal to 30 micrometers, and a part of the graphene microplates 121 protrude from two opposite surfaces of the adhesive layer 12. Therefore, the adhesion structure 1 has the following advantages. (1) Since the graphene microplates 121 has very thin thickness (between 0.3 nm and 3 nm), small flake diameter (between 1 μm and 30 μm), and high thermal conductive coefficient, the adhesion structure 1 can not only provide the adhesive function, but also improve the heat dissipation efficiency of electronic device through the good thermal conduction of the graphene microplates 121. (2) Since the graphene microplates 121 have high Young's modulus, the entire strength of the adhesion structure 1 can be enhanced. (3) Since the graphene microplates 121 also have the ability of absorbing electromagnetic waves, the adhesion structure 1 can provide the function of shielding the electromagnetic waves.

Figure 3:
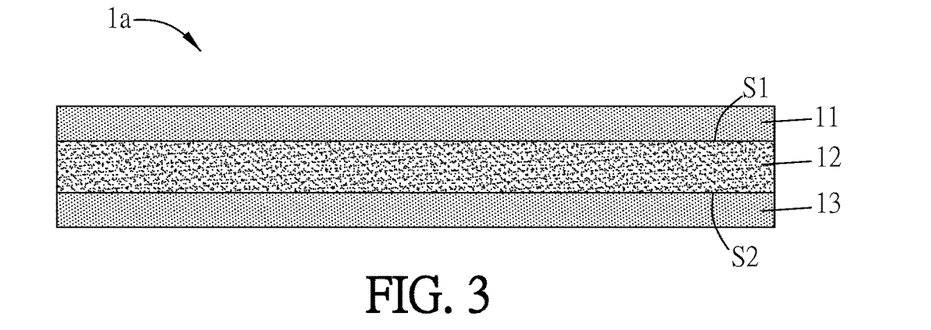
FIG. 3 is a schematic diagram of an adhesion structure according to another embodiment of this disclosure.

FIG. 3 is a schematic diagram of an adhesion structure according to another embodiment of this disclosure.

The configuration and connection of the components of the adhesion structure 1a as shown in FIG. 3 are mostly the same as those of the adhesion structure 1 of the previous embodiment. Different from the previous embodiment, the adhesion structure 1a of this embodiment further comprises a release layer 13. The release layer 13 is disposed at one side of the adhesive layer 12 away from the substrate 11. In this embodiment, the release layer 13 is disposed on the lower surface S2 of the adhesive layer 12 for protecting the adhesive property of the adhesive layer 12 and allowing the adhesion structure 1a to be a single-sided adhesion. The material of the release layer 13 can be, for example but not limited to, paper, cloth, polyester (e.g. polyethylene terephthalate, PET), or a combination thereof, and this disclosure is not limited thereto. In practice, the user can peel off the release layer 13, and then attach the lower surface S2 of the adhesive layer 12 to an object, thereby adhering the adhesion structure 1a including the substrate 11 and the adhesive layer 12 to the object. In some embodiments, the adhesion structure 1a can be an ultra-thin single-sided adhesion, and the thickness thereof is, for example, less than or equal to 2 μm.

Figure 4A:
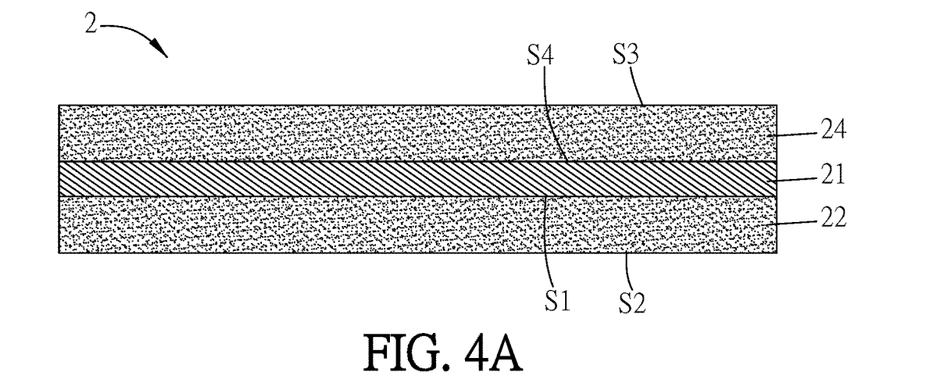
FIGS. 4A and 4B are schematic diagrams of adhesion structures according to different embodiments of this disclosure.
Figure 4B:
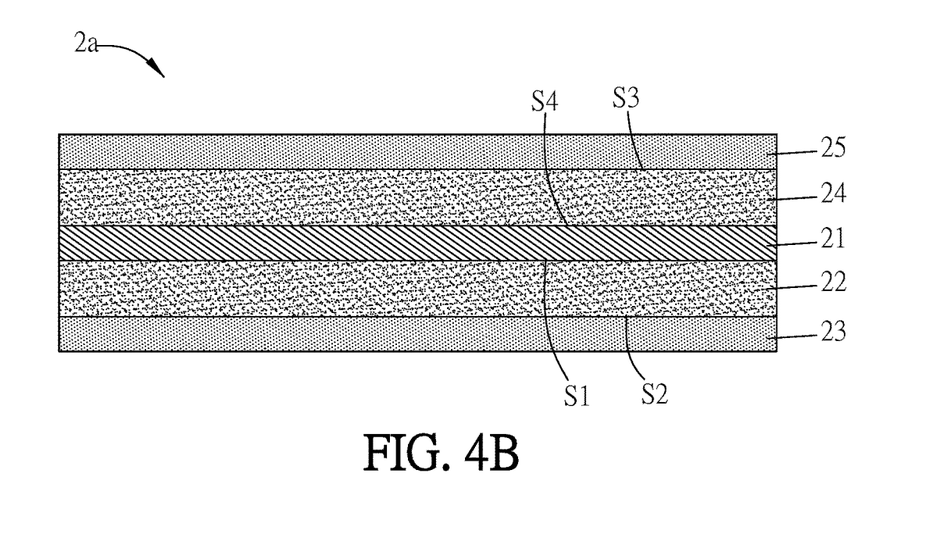

FIGS. 4A and 4B are schematic diagrams of adhesion structures according to different embodiments of this disclosure.

As shown in FIG. 4A, the adhesion structure 2 comprises a substrate 21, a first adhesive layer 22 and a second adhesive layer 24.

The material of the substrate 21 can be, for example but not limited to, paper, cloth, polyester (e.g. polyethylene terephthalate, PET), or a combination thereof, and this disclosure is not limited thereto. In this embodiment, the material of the substrate 21 is PET, which can increase the support and structural strength of the adhesion structure 2.

The first adhesive layer 22 is disposed on the substrate 21. In this embodiment, the first adhesive layer 22 is disposed on the lower surface of the substrate 21. Similar to the adhesive layer 12 of the above-mentioned adhesion structure 1, the first adhesive layer 22 of this embodiment comprises a plurality of first graphene microplates and an adhesion material, and the first graphene microplates are mixed in the adhesion material. The adhesion material can be, for example but not limited to, a pressure sensitive adhesive (PSA). The material of the adhesion material can be, for example, a rubber material, an acrylic material, a silicone material, or a combination thereof. The chemical composition thereof can be rubber, acrylic, or organic silicone, or a combination thereof. The present disclosure is not limited. Moreover, similar to the graphene microplates 121 of the above-mentioned adhesion structure 1, the thickness of each first graphene microplate of the first adhesive layer 22 can be greater than or equal to 0.3 nanometers and is less than or equal to 3 nanometers, and the flake diameter of each first graphene microplate can be greater than or equal to 1 micrometer and is less than or equal to 30 micrometers. Similar to the adhesive layer 12 of the above-mentioned adhesion structure 1, in the first adhesive layer 22, the content of the first graphene microplates can be greater than 0 and less than or equal to 15% (such as 1.5%, 3.2%, 5%, 7.5%, 11%, or 13%). Similar to the adhesive layer 12 of the above-mentioned adhesion structure 1, in the first adhesive layer 22, a part of the first graphene microplates are completely disposed inside the first adhesive layer 22, and a part of the first graphene microplates protrude from two opposite surfaces (the upper surface S1 and the lower surface S2) of the first adhesive layer 22.

The second adhesive layer 24 is disposed at one side of the substrate 21 away from the first adhesive layer 21. In this embodiment, the second adhesive layer 24 is disposed on the upper surface of the substrate 21, which is away from the first adhesive layer 22. The material, dimension (thickness, flake diameter, etc.), and scale of the second adhesive layer 24 can be the same as those of the first adhesive layer 22. The second adhesive layer 24 comprises a plurality of second graphene microplates and an adhesion material, and the second graphene microplates are mixed in the adhesion material. A part of the second graphene microplates protrude from two opposite surfaces (the upper surface S3 and the lower surface S4) of the second adhesive layer 24. To be noted, in other embodiments, the second adhesive layer 24 and the first adhesive layer 22 can be made of the same material, but the dimensions and scales thereof can be different. This disclosure is not limited.

In this embodiment, the adhesion structure 2 is a double-sided adhesion, and the thickness thereof can be, for example, greater than or equal to 3 μm. In practice, the lower surface S2 of the first adhesive layer 22 is attached to the object (e.g. the heat source) so as to adhere the adhesion structure 2 to the object. The upper surface S3 of the second adhesive layer 24 can be, for example, connected to a heat dissipation structure. In this embodiment, the heat dissipation structure can be, for example, a heat dissipation film such as, for example but not limited to, a graphene thermal film (GTF). In other embodiments, the adhesion structure 2 can be attached to the object (e.g. the heat source) through the upper surface S3 of the second adhesive layer 24, and the lower surface S2 of the first adhesive layer 22 is connected to the heat dissipation structure. This disclosure is not limited.

As shown in FIG. 4B, the composition and connection of the adhesion structure 2a of this embodiment are mostly the same as those of the adhesion structure 2 of the previous embodiment. Different from the previous embodiment, the adhesion structure 2a of this embodiment further comprises a first release layer 23 and a second release layer 25.

Similar to the release layer 13 of the above-mentioned adhesion structure 1, the first release layer 23 of this embodiment is disposed at one side of the first adhesive layer 22 away from the substrate 21. In this embodiment, the first release layer 23 is disposed on the lower surface S2 of the first adhesive layer 22, which is away from the substrate 21. In addition, the second release layer 25 is disposed at one side of the second adhesive layer 24 away from the substrate 21. In this embodiment, the second release layer 25 is disposed on the upper surface S3 of the second adhesive layer 24, which is away from the substrate 21. In some embodiments, the adhesion structure 2a is a double-sided adhesion, and the thickness thereof can be, for example, greater than or equal to 3 μm. Moreover, the material of the second release layer 25 can be the same as or different from the material of the first release layer 23, and this disclosure is not limited.

In practice, the user can peel off the first release layer 23, and then attach the lower surface S2 of the first adhesive layer 22 to an object (e.g. the heat source), thereby adhering the adhesion structure 2a to the object. In addition, the user can also peel off the second release layer 25, and then attach the upper surface S3 of the second adhesive layer 24 to, for example, a heat dissipation structure (e.g. the heat dissipation film). According to this configuration, the heat energy of the heat source can be conducted to the heat dissipation structure through the adhesion structure 2a, thereby enhancing the heat dissipation efficiency.

This disclosure also provides an electronic device, which comprises a heat source, an adhesion structure and a heat dissipation structure. The adhesion structure is disposed on the heat source, and the heat dissipation structure is connected to the heat source through the adhesion structure. In this embodiment, the adhesion structure can be selected from any of the above-mentioned adhesion structures 1, 1a, 2 and 2a, or any of the modifications thereof. The specific technical contents thereof can be referred to the above-mentioned embodiments, so the detailed descriptions thereof will be omitted. The adhesive layer of the adhesion structure comprises a plurality of graphene microplates, and a part of the graphene microplates protrude from two opposite surfaces of the adhesive layer. Accordingly, the graphene microplates can contact the heat source and the heat dissipation structure and provide the heat conduction path for transmitting the heat energy from the heat source to the heat dissipation structure through the adhesion structure, thereby dissipating the heat energy generated by the electronic device through the heat dissipation structure.

The electronic device can be, for example but not limited to, a flat display device or a flat light source, such as, for example but not limited to, a mobile phone, a laptop computer, a tablet computer, a TV, a display device, a backlight module, or a lighting module, or any of other flat electronic devices. In some embodiments, when the electronic device is a flat display device such as, for example but not limited to, a light emitting diode (LED) display device, an organic light emitting diode (OLED) display device, or a liquid crystal display (LCD) device, the heat source can be a display panel with a display surface. The adhesion structure can be directly or indirectly (e.g. through an adhesion material) attached to the surface of the display panel opposite to the display surface. Accordingly, the adhesion structure can connect the heat dissipation structure to the heat source, and assist the heat conduction and heat dissipation, thereby improving the heat dissipation efficiency of the flat display device. In other embodiments, when the electronic device is a flat light source such as, for example but not limited to, a backlight module, an LED lighting module, or an OLED lighting module, the heat source can be a light-emitting unit, which has a light emitting surface. The adhesion structure can be directly or indirectly (e.g. through the adhesion material) attached to the surface opposite to the light emitting surface. Accordingly, the adhesion structure can connect the heat dissipation structure to the heat source, and assist the heat conduction and heat dissipation, thereby improving the heat dissipation efficiency of the flat light source.

FIGS. 5A to 5F are schematic diagrams showing the adhesion structure of this disclosure applied to the heat dissipation of a display device.

Figure 5A:
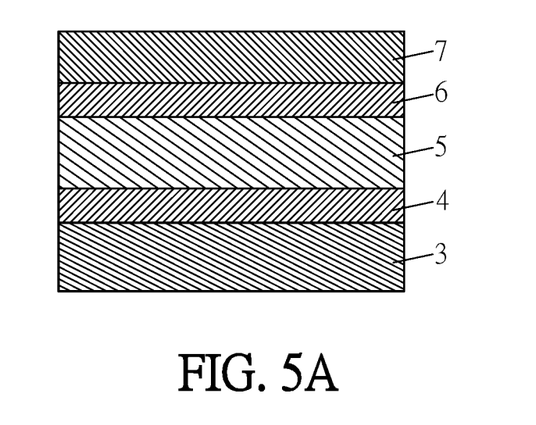
FIGS. 5A to 5F are schematic diagrams showing the adhesion structure of this disclosure applied to the heat dissipation of a display device.

In some applications as shown in FIG. 5A, an adhesion structure 4, a heat dissipation film 5, another adhesion structure 6, and an elastic heat dissipation structure 7 are stacked on the back surface (the surface opposite to the display surface) of the display device 3 (the heat source, e.g. an OLED display panel) in order. The elastic heat dissipation structure 7 comprises a porous elastic member and a plurality of heat conductive members. The porous elastic member can be an elastic foam structure and comprise a plurality of pores. The material of the porous elastic member can be the same as that of a general foam, such as, for example but not limited to, acrylic resin, polyurethane (PU), polyethylene (PE), polypropylene (PP), ethylene-propylene-diene monomer (EPDM), ethylene vinyl acetate copolymer resin (EVA resin), or a combination thereof. Among the above-mentioned materials, the bubble shape formed by acrylic resin and polyurethane is a semi-closed cell, which has good flexibility and compressibility, good vibration absorption capacity, and good heat stability. The bubble shape formed by polyethylene and polypropylene is a closed cell, which has relatively poor compressibility and vibration absorption capacity, but has better humidity stability.

The heat conductive members are mixed in the porous elastic member. The heat conductive member can be a high heat conductive material and be prepared as the shape of particles, powders or microplates. The material of the heat conductive member can be, for example but not limited to, graphene, graphite, carbon nanotubes, aluminum oxide, zinc oxide, titanium oxide, boron nitride (BN), or a combination thereof, or any of other suitable high heat conductive materials. The material of the heat conductive member of this embodiment is graphene microplates, which are mixed in the porous elastic member in a "closest packing" manner. The limitations and conditions of the thickness and flake diameter of the graphene microplates can be referred to the above embodiments. Due to the "closest packing" structure, the contact area of the heat conductive member can be increased, so that the elastic heat dissipation structure 7 can achieve a relatively higher heat conduction effect.

Figure 5B:
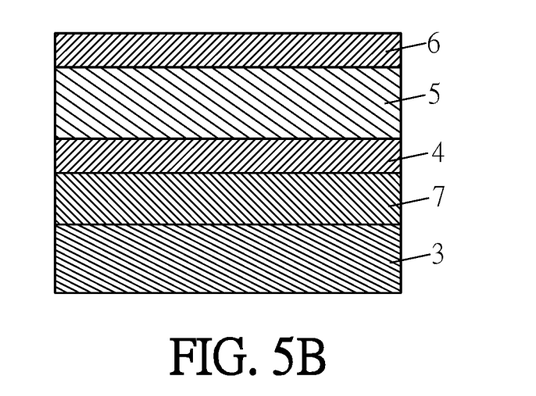

As shown in FIG. 5B, an elastic heat dissipation structure 7, an adhesion structure 4, a heat dissipation film 5, and another adhesion structure 6 are stacked on the back surface of the display device 3 in order.

Figure 5C:
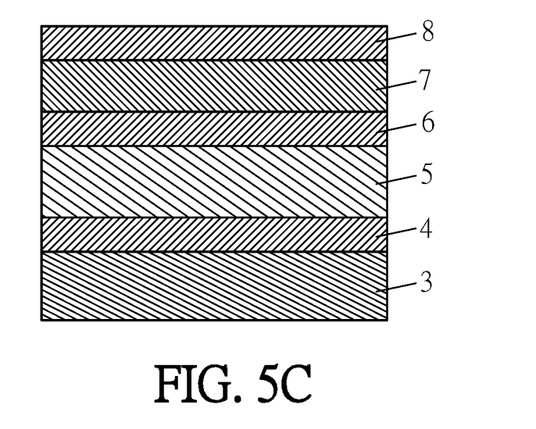

As shown in FIG. 5C, an adhesion structure 4, a heat dissipation film 5, another adhesion structure 6, an elastic heat dissipation structure 7, and another adhesion structure 8 are stacked on the back surface of the display device 3 in order.

Figure 5D:
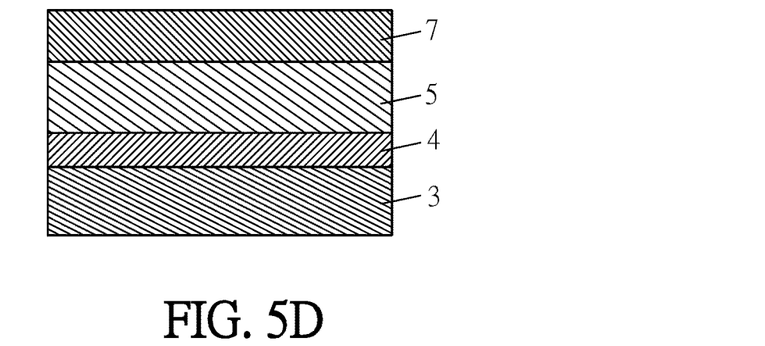

As shown in FIG. 5D, an adhesion structure 4, a heat dissipation film 5, and an elastic heat dissipation structure 7 are stacked on the back surface of the display device 3 in order.

Figure 5E:
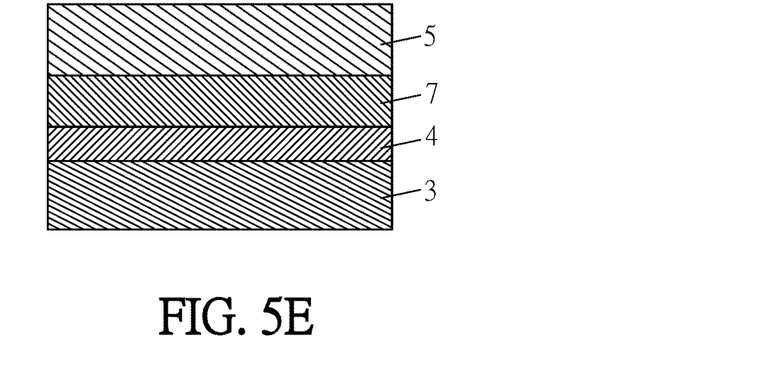

As shown in FIG. 5E, an adhesion structure 4, an elastic heat dissipation structure 7, and a heat dissipation film 5 are stacked on the back surface of the display device 3 in order.

Figure 5F:
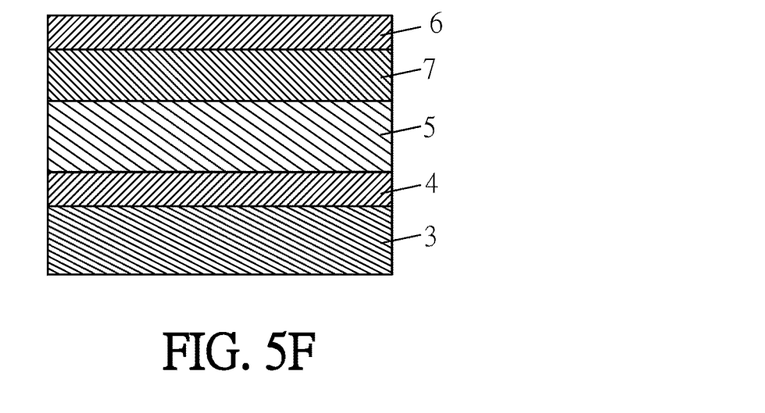

As shown in FIG. 5F, an adhesion structure 4, a heat dissipation film 5, an elastic heat dissipation structure 7, and another adhesion structure 6 are stacked on the back surface of the display device 3 in order.

Each of the adhesion structures 4, 6 and 8 can be any of the above-mentioned adhesion structures 1, 1a, 2 and 2a, and the modifications thereof, and this disclosure is not limited. In addition, the stacked configurations of the display device 3, the elastic heat dissipation structure 7, the heat dissipation film 5, and the adhesion structures 4, 6 and 8 in the above embodiments are for illustrations only. In other applications, these components can have different arrangements and configurations, which are determined based on the heat dissipation requirement of the heat source. This disclosure is not limited.

In summary, in the adhesion structure and the electronic device with the adhesion structure of this disclosure, the adhesive layer(s) comprises graphene microplates, a part of the graphene microplates protrude from two opposite surfaces of the adhesive layer, and the graphene microplates are defined within specific conditions. Accordingly, the adhesion structure of this disclosure can provide the adhesive function, and improve the heat dissipation efficiency of electronic device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An adhesion structure, comprising:
   a substrate; and
   a first adhesive layer disposed on the substrate, wherein the first adhesive layer comprises a plurality of first graphene microplates;
   wherein, a part of the first graphene microplates protrude from two opposite surfaces of the first adhesive layer, a thickness of each of the first graphene microplates is greater than or equal to 0.3 nanometers and is less than or equal to 3 nanometers, and a flake diameter of each of the first graphene microplates is greater than or equal to 1 micrometer and is less than or equal to 30 micrometers.

2. The adhesion structure of claim 1, wherein the first adhesive layer further comprises an adhesion material, and the first graphene microplates are mixed in the adhesion material.

3. The adhesion structure of claim 1, further comprising:
   a first release layer disposed at one side of the first adhesive layer away from the substrate.

4. The adhesion structure of claim 1, further comprising:
   a second adhesive layer disposed at one side of the substrate away from the first adhesive layer, wherein the second adhesive layer comprises a plurality of second graphene microplates, and a part of the second graphene microplates protrude from two opposite surfaces of the second adhesive layer.

5. The adhesion structure of claim 4, wherein a thickness of each of the second graphene microplates is greater than or equal to 0.3 nanometers and is less than or equal to 3 nanometers, and a flake diameter of each of the second graphene microplates is greater than or equal to 1 micrometer and is less than or equal to 30 micrometers.

6. The adhesion structure of claim 4, further comprising:
   a second release layer disposed at one side of the second adhesive layer away from the substrate.

7. An electronic device, comprising:
   a heat source;
   an adhesion structure disposed on the heat source, wherein the adhesion structure comprises a substrate, a first adhesive layer and a second adhesive layer, the first adhesive layer is disposed on the substrate, the second adhesive layer is disposed at one side of the substrate away from the first adhesive layer, the first adhesive layer or the second adhesive layer comprises a plurality of graphene microplates, a part of the graphene microplates protrude from two opposite surfaces of the first adhesive layer or the second adhesive layer, a thickness of each of the graphene microplates is greater than or equal to 0.3 nanometers and is less than or equal to 3 nanometers, and a flake diameter of each of the graphene microplates is greater than or equal to 1 micrometer and is less than or equal to 30 micrometers; and
   a heat dissipation structure connected to the heat source through the adhesion structure.

8. The electronic device of claim 7, wherein the first adhesive layer further comprises an adhesion material, and the graphene microplates are mixed in the adhesion material.

9. The electronic device of claim 7, wherein the second adhesive layer further comprises an adhesion material, and the graphene microplates are mixed in the adhesion material.

10. The electronic device of claim 7, wherein the heat dissipation structure is a graphene conductive film.

11. The electronic device of claim 7, further comprising:
an elastic heat dissipation structure disposed at one side of the heat dissipation structure away from the adhesion structure.

12. The electronic device of claim 7, further comprising:
an elastic heat dissipation structure disposed between the heat source and the adhesion structure.

* * * * *